(12) United States Patent
Zhang et al.

(10) Patent No.: US 8,698,666 B1
(45) Date of Patent: Apr. 15, 2014

(54) RANDOM ESTIMATION ANALOG-TO-DIGITAL CONVERTER

(71) Applicant: Omnivision Technologies, Inc., Santa Clara, CA (US)

(72) Inventors: Guangbin Zhang, Cupertino, CA (US); Jiangtao Kuang, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 54 days.

(21) Appl. No.: 13/633,017

(22) Filed: Oct. 1, 2012

(51) Int. Cl.
*H03M 1/12* (2006.01)
*H03M 1/00* (2006.01)
*H03M 1/06* (2006.01)

(52) U.S. Cl.
CPC ............. *H03M 1/00* (2013.01); *H03M 1/0673* (2013.01)
USPC ............................. 341/155; 341/118; 341/120

(58) Field of Classification Search
CPC ........................................................ H03M 1/00
USPC .................................. 341/118, 120, 155, 119
See application file for complete search history.

(56) References Cited

U.S. PATENT DOCUMENTS

| | | | |
|---|---|---|---|
| 5,061,927 A | 10/1991 | Linnenbrink et al. | |
| 6,317,070 B1 | 11/2001 | Yuan | |
| 6,369,737 B1 | 4/2002 | Yang et al. | |
| 7,095,346 B2 * | 8/2006 | Bogner | 341/120 |
| 7,800,521 B2 * | 9/2010 | Madisetti et al. | 341/118 |

OTHER PUBLICATIONS

Nandakumar, S., "High Resolution Floating Point ADC," M.Tech. Credit Seminar Report, Electronics Systems Group, EE Dept., IIT Bombay, Submitted Nov. 2004, pp. 1-19.

* cited by examiner

*Primary Examiner* — Jean B Jeanglaude
(74) *Attorney, Agent, or Firm* — Blakely Sokoloff Taylor & Zafman LLP

(57) ABSTRACT

A random estimation analog-to-digital converter for converting a first analog signal into a digital signal includes a random bit generator, a digital-to-analog converter, a summer, an M-bit analog-to-digital converter, and a digital combiner. The random bit generator generates random least significant bits (LSBs) and the digital-to-analog converter then converts the random LSBs into a second analog signal. The summer subtracts the second analog signal from the first analog signal in the analog domain. The M-bit analog-to-digital converter then converts the modified first analog signal into the most significant bits (MSBs) of the digital image signal. The digital combiner combines the random LSBs with the MSBs in the digital domain to generate the digital signal. In one example, the random LSBs are extra bits that are beyond the maximum resolution of the M-bit analog-to-digital converter.

24 Claims, 5 Drawing Sheets

RANDOM ESTIMATION ANALOG-TO-DIGITAL CONVERTER

BACKGROUND

1. Field of the Invention

This disclosure relates generally to analog-to-digital converters, and in particular, but not exclusively, to those used in the readout circuitry of a complementary metal-oxide-semiconductor (CMOS) image sensor.

2. Background Information

Image sensors are ubiquitous. They are widely used in digital still cameras, digital video cameras, cellular phones, security cameras, medical devices, automobiles, and other applications.

Many image sensor applications benefit from an increased high dynamic range (HDR). However, increasing the dynamic range in a conventional image sensor typically means a slower, more complex and increased power consuming analog-to-digital converter (ADC).

One known type of ADC is a floating point ADC. A floating point ADC attempts to increase the overall dynamic range of the ADC by directly performing floating point analog-to-digital conversion. In one example, a floating point ADC includes a programmable gain amplifier (PGA) that amplifies the analog input signal with a gain corresponding to a selected range. However, conventional floating point ADCs may suffer from step/quantization error that will limit the effectiveness of the ADC.

BRIEF DESCRIPTION OF THE DRAWINGS

The invention may be understood by referring to the following description and accompanying drawings that are used to illustrate embodiments. In the drawings.

DETAILED DESCRIPTION

In the following description, numerous specific details are set forth, such as, for example, specific readout circuits, voltage ramp signals, calibration circuits orders of operations, etc. However, it is understood that embodiments may be practiced without these specific details. In other instances, well-known circuits, structures and techniques have not been shown in detail in order not to obscure the understanding of this description.

Figure 1:
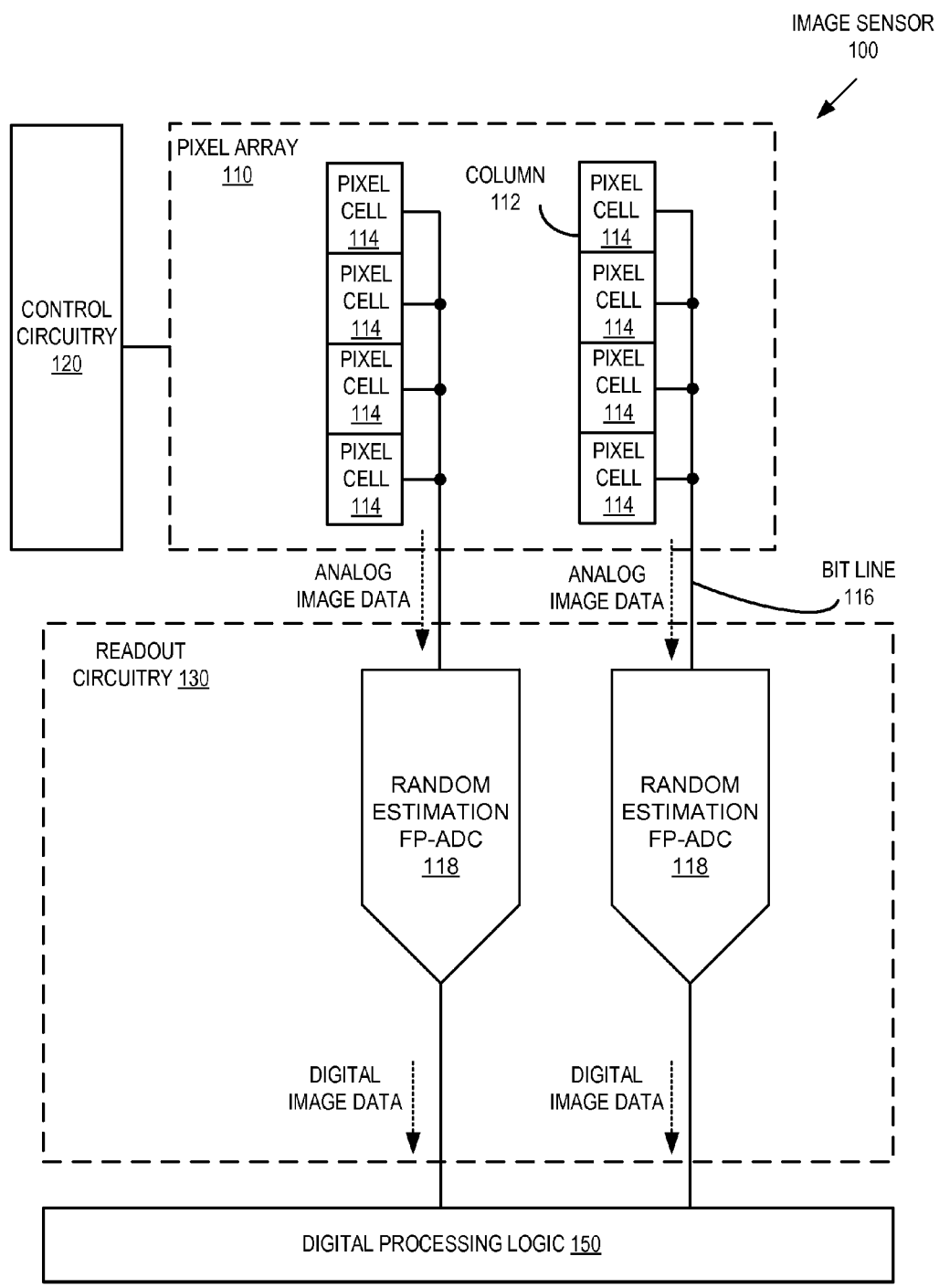
FIG. 1 is a block diagram illustrating an image sensor having multiple random estimation ADCs, in accordance with an embodiment of the present disclosure.

FIG. 1 is a block diagram illustrating image sensor 100 having multiple random estimation ADCs 118, in accordance with an embodiment of the present disclosure. Image sensor 100 includes pixel array 110, control circuitry 120, readout circuitry 130, and optional digital processing logic 150. For simplicity of illustration, the illustrated embodiment of pixel array 110 only shows two columns 112, each having four pixel cells 114. However, it is to be appreciated that actual image sensors commonly include from hundreds to thousands of columns, and each column commonly includes from hundreds to thousands of pixels. Also, the illustrated pixel array 110 is regularly shaped (e.g., each column 112 has the same number of pixels), but in other embodiments the array may have a regular or irregular arrangement different than shown and can include more or less pixels, rows, and columns than shown. Moreover, in different embodiments pixel array 110 may be a color image sensor including red, green, and blue pixels designed to capture images in the visible portion of the spectrum, or may be a black-and-white image sensor and/or an image sensor designed to capture images in the invisible portion of the spectrum, such as infra-red or ultraviolet. In one embodiment, image sensor 100 is a complementary metal oxide semiconductor (CMOS) image sensor.

During use, after pixel cell 114 has acquired its image data or charge, the analog image data (e.g., analog signal) or charge may be read out of the pixel cell to readout circuitry 130 via column readout lines or bit lines 116. The analog image data from pixel cells 114 of each column 112 is read out via bit line 116 one pixel at a time to readout circuitry 130 and then transferred to random estimation floating-point (FP) ADCs 118.

Random estimation floating-point ADCs 118 are floating point ADCs that estimate the least significant bits (LSBs) of a conversion with one or more random bits. The random LSBs are then converted into an analog signal and subtracted from the analog image data. The modified analog image data is then converted using an M-bit ADC to generate one or more most significant bits (MSBs). The random LSBs and the MSBs are then combined to generate the digital image data (i.e., a digital signal) which is output from readout circuitry 130 and provided to optional digital processing logic 150 for further processing. In the illustrated embodiment, random estimation floating-point ADC 118 is used in an image sensor 100. However, in other embodiments, random estimation floating-point column ADC 118 may be used in other semiconductor circuits.

Figure 2:
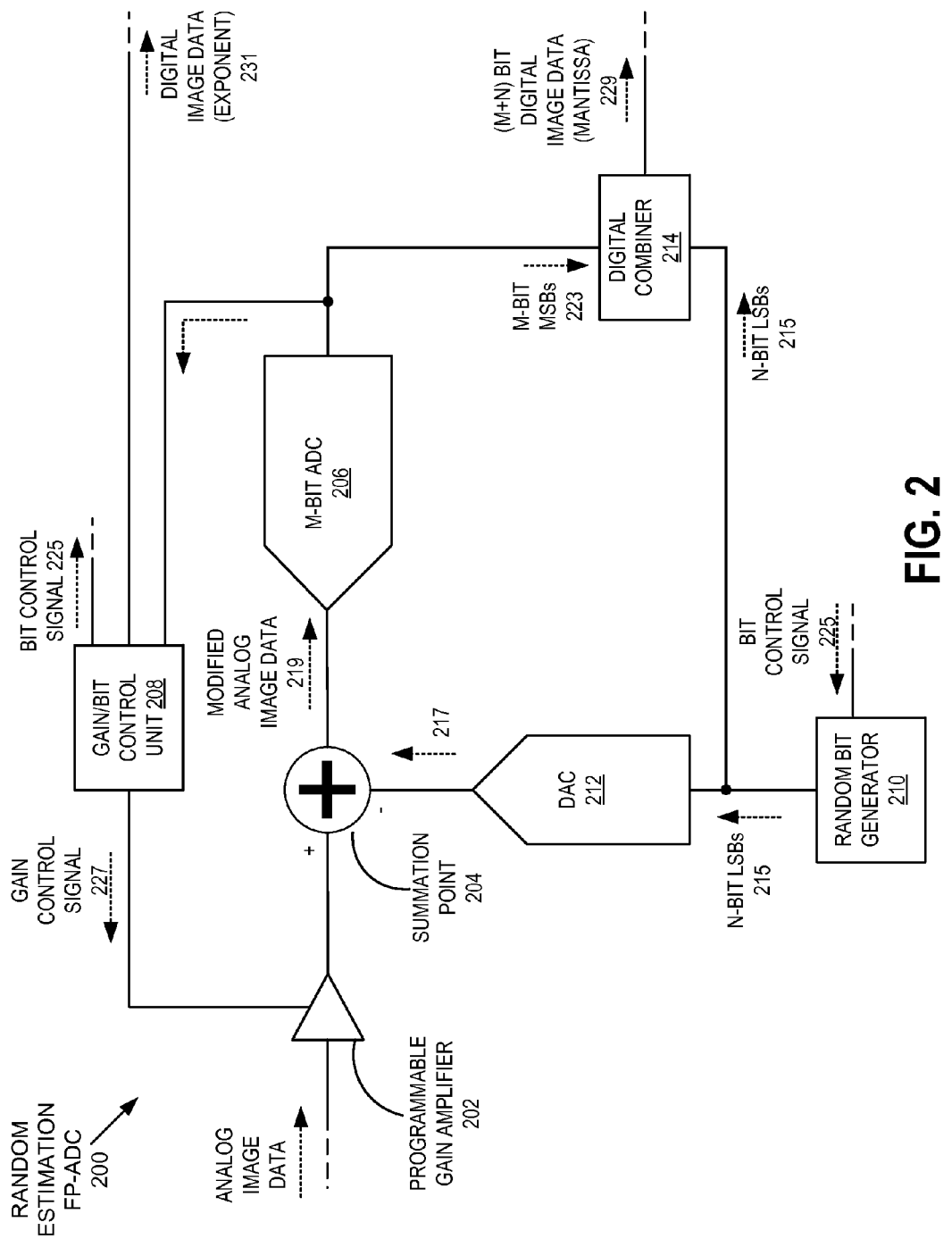
FIG. 2 is a block diagram illustrating an example random estimation ADC, in accordance with an embodiment of the present disclosure.

FIG. 2 is a block diagram illustrating an example random estimation floating-point ADC 200, in accordance with an embodiment of the present disclosure. The illustrated example of hybrid ADC 200 includes programmable gain amplifier 202, summation point 204 (i.e., summer), M-bit ADC 206, gain/bit control unit 208, random bit generator 210, digital-to-analog converter (DAC) 212, and digital combiner 214. Also shown in FIG. 2 are several signals, including the analog image data signal, N-bit LSBs 215, DAC output 217 (i.e., analog signal), modified analog image data 219, M-bit MSBs 223, bit control signal 225, and gain control signal 227. Floating-point ADC 200 is one possible implementation of floating-point ADC 118 of FIG. 1.

In the embodiment of FIG. 2, programmable gain amplifier 202 is coupled to receive an analog signal (e.g., analog image data). Programmable gain amplifier 202 is configured to apply a variable gain to the analog signal in response to the gain control signal 227. In one embodiment, the gain control signal 227 representative of the range for the current analog-to-digital conversion. Thus, the gain of programmable gain amplifier may vary as the desired range of ADC 200 changes.

The output of programmable gain amplifier 202 is coupled to be received by the summation point 204. Summation point 204 is also coupled to the output of digital-to-analog converter (DAC) to receive analog signal 217. Summation point 204 is configured to subtract the analog signal 217 from the amplified analog image data in the analog domain. For example, summation point 204 may include a differential amplifier to subtract the analog signal 217 from the analog image data.

Summation point 204 is coupled to generate a modified analog image data signal 219. In one embodiment, the modified analog image data 219 is the result of the subtraction mentioned above of the analog image data and analog signal 217. M-bit ADC 206 is coupled to summation point 204 to receive the modified analog image data 219. In one embodiment, M-bit ADC 206 includes a fixed linear ADC that has a maximum resolution of M number of bits. M-bit ADC 206 is coupled to generate the most-significant-bits (MSBs) of the mantissa of the digital image data 229 by way of digital combiner 214.

As shown in FIG. 2, the output of M-bit ADC 206 is coupled to gain/bit control unit 208. Gain/bit control unit 208 is configured to set the gain of programmable gain amplifier 202 in response to the output of M-bit ADC 206 so as to select the appropriate range of ADC 200. Gain/bit control unit 208 may include one or more logic circuits configured to set the gain of programmable amplifier 202 and to generate the exponent portion 231 of the digital image data. In the illustrated embodiment, gain/bit control unit 208 is also coupled to generate a bit control signal 225 to control the number of random bits generated by random bit generator 210.

Random bit generator 210 is configured to generate N number of least significant bits, where the N number of bits is responsive to the bit control signal 225 generated by the gain/bit control unit 208. The N-bit LSBs 215 are received by DAC 212 to generate the analog signal 217, where analog signal 217 is an analog representation of the N-bit LSBs 215.

Digital combiner 214 is coupled to receive the N-bit LSBs 215 and the M-bit MSBs 223 to combine the two to generate the M+N bit digital image data 229 in the digital domain. In one embodiment, digital combiner combines the N-bit LSBs 215 and the M-bit MSBs 223 by shifting the M-bit MSBs 223 by N number of bits and then adding the N-bit LSBs 215 with the shifted M-bit MSBs 223. Thus, the resultant digital image data includes M+N number of bits which may exceed the maximum resolution of M-bit ADC 206 by itself.

Figure 3:
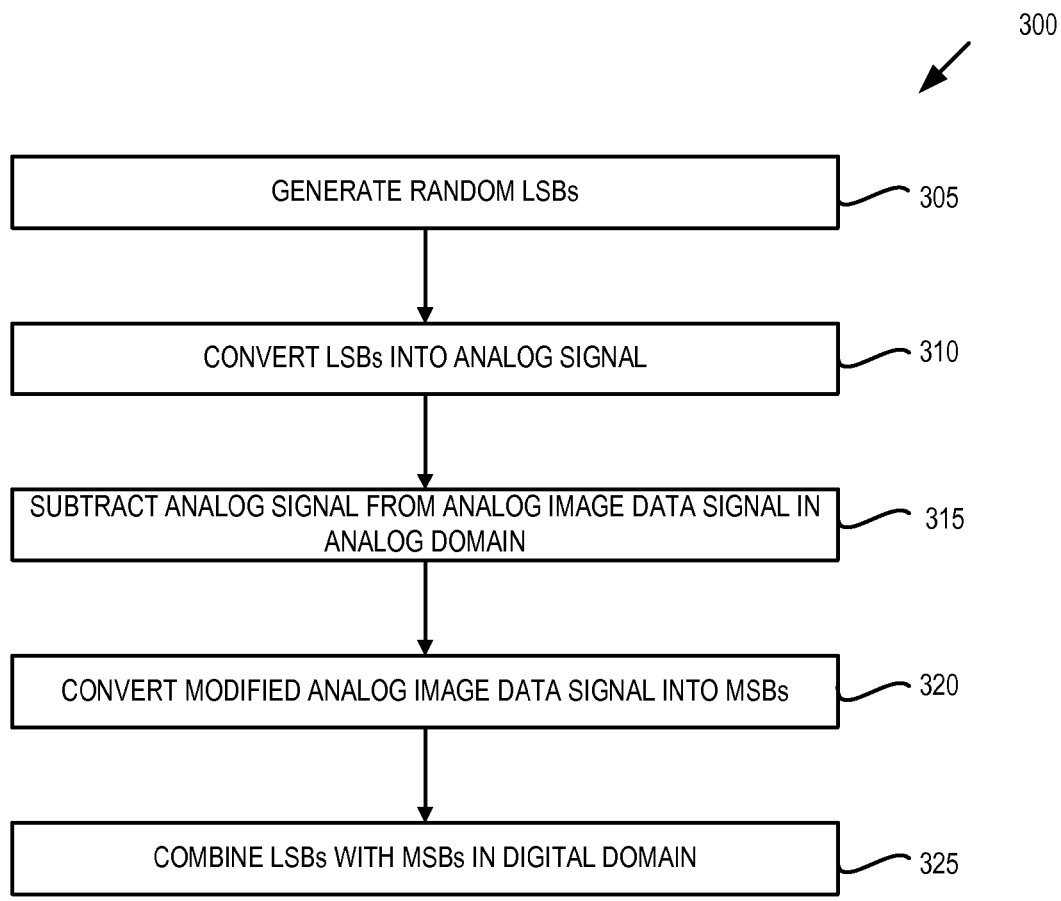
FIG. 3 is a flow diagram illustrating of an example analog-to-digital conversion process using a random estimation ADC, in accordance with an embodiment of the present disclosure.

FIG. 3 is a flow diagram illustrating of an example analog-to-digital conversion process 300 using random estimation FP-ADC 200 of FIG. 2, in accordance with an embodiment of the present disclosure. In process block 305 random bit generator 210 generates N number of random bits, where N is determined by bit control signal 225. In one embodiment, not shown, random bit generator 210 may generate a continuous stream of random bits where DAC 212 receives the bit control signal to select the N number of bits from the stream of random bits.

Next, in process block 310, DAC 212 converts the N-bit LSBs 215 into analog signal 217. In a process block 315 summation point 204 subtracts the analog signal 217 from the amplified analog image data (i.e., output of programmable gain amplifier 202). As mentioned above, the subtraction of the analog signal 217 from the analog image data is done in the analog domain. The summation point 204 then outputs a modified analog image data 219 which is then converted into M-bit MSBs. In one embodiment, M-bit ADC 206 has a maximum resolution of M bits. In other words, the N-bit LSBs are extra bits that exceed the maximum resolution of the M-bit ADC 206 effectively extending the resolution of ADC 200.

In process block 325, digital combiner 214 combines the M-bit MSBs 223 with the N-bit LSBs 215 to generate the M+N Bit digital image data 229. In the illustrated embodiment, the output of random estimation FP-ADC 200 is a floating point output, where the M+N Bit digital image data 229 is the mantissa and where the exponent of the floating point output is provided by gain/bit control unit 208.

Thus, embodiments of the present disclosure may provide a floating point ADC that has almost the same quality as a higher-bit count fixed point ADC, thus reducing costs, power consumption, and conversion times. Generally, as the analog input (e.g., analog image data) gets larger, gain/bit control unit 208 will select a larger range of the ADC by setting the appropriate gain of programmable gain amplifier 202. Also, as the range increases, so too does the number N of LSBs also set by gain/bit control unit 208. However, as stated above the M-bit ADC 206 is a fixed linear ADC, with a maximum resolution of M-bits. Therefore, embodiments of the present invention may extend the resulution of ADC 200 past that of simply the M-bit ADC 206 by itself.

Figure 4:
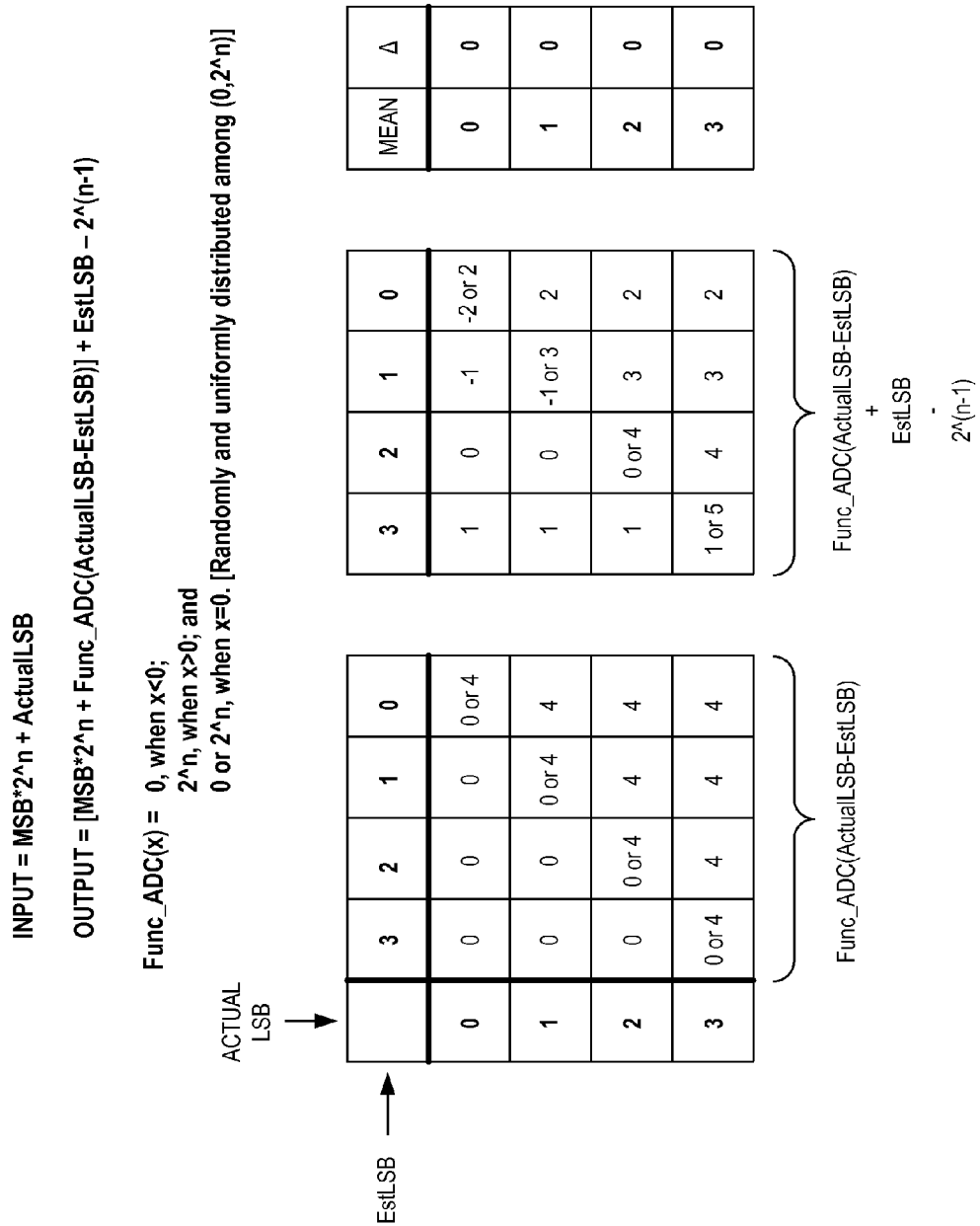
FIG. 4 is a table illustrating a example of random estimation, in accordance with an embodiment of the present disclosure.

FIG. 4 is a table illustrating a example of random estimation, in accordance with an embodiment of the present disclosure. As shown in FIG. 4, the input (e.g., analog image data) to random estimation FP-ADC 200 may be digitally represented and mathematically split into two parts—an MSB portion and an LSB portion, as indicated by EQ. 1 as follows:

$$\text{INPUT} = \text{MSB} * 2^n + \text{ActualLSB}, \quad [\text{EQ. 1}]$$

where MSB represents the most significant bits, n is the number of least significant bits and Actual LSB represents the n number of the actual least significant bits. The output of random estimation FP-ADC 200 may be represented by EQ. 2, as follows:

$$\text{OUTPUT} = [\text{MSB} * 2^n + \text{Func\_ADC}(\text{ActualLSB} - \text{EstLSB})] + \text{EstLSB} - 2^{(n-1)}, \quad [\text{EQ.2}]$$

where EstLSB is n number of random bits representative of a random integer from 0 to $(2^n)-1$, and the Func_ADC(x) is represented by the following EQ. 3:

Func_ADC($x$)=0, when $x$<0, $2^n$, when $x$>0, and 0 or $2^n$, when $x$=0, randomly and uniformly distributed among $(0, 2^n)$ [EQ. 3]

distributed among $(0, 2^n)$

As shown in FIG. 2, at least a portion of EQ. 2 in the brackets (i.e., [MSB*2^n+Func_ADC(ActualLSB−EstLSB)]) may be performed in the analog domain by summation point 204 and M-bit ADC 206, where the Func_ADC is utilized to introduce a low resolution quantization error which may cause a data shift. The remainder of the functions represented by EQ. 2 may be performed in the digital domain by digital combiner 214. For example, digital combiner may shift the M-Bit MSBs 223 by N number of bits (i.e., *2^n), then add the shifted MSBs to the N-Bit LSBs 215 (i.e., EstLSB), and finally may subtract the quantity $2^{(n-1)}$ to reduce the quantization error that caused the data shift. An example table of results of an analog-to-digital conversion by random estimation FP-ADC 200 using n=2 LSBs is shown in FIG. 4.

With a 2-bit LSB, the possible integer representations of the LSBs are 3, 2, 1, and 0. Using the estimated LSBs (EstLSB) and the actual LSBs (ActualLSBs) in EQ. 3 there are three possible results 0, 4, and 0 or 4. Using the results of EQ. 3 in the remainder of EQ. 2 (shown in the middle table of FIG. 4) we get resultant integer representations of the LSB ranging from −1 to 5. For example, if the actual integer representation of the 2-bit LSB is 1, and the random bit generator 210 generates two random bits equal to the integer value of 2, then the result of EQ. 3 would be 4 with the resultant LSB using the rest of EQ. 2 being an integer value of 3 (e.g., 4+1-2).

The third table on the right of FIG. 4 illustrates the mean value of all possible resultant LSBs using the random estimated LSBs. As shown in this embodiment, the mean value exactly corresponds with the actual values of LSBs, which gives a delta of zero for each. The results of the analog-to-digital conversion using random estimation FP-ADC 200 may be more clearly seen by way of the histograms of FIGS. 5A-5C.

Figure 5A:
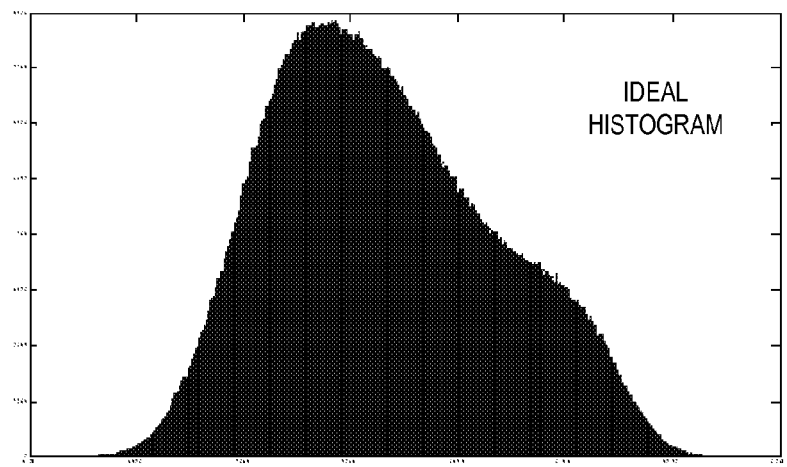
FIGS. 5A-5C are histograms illustrating the difference between an ADC with step error to a random estimation ADC, in accordance with an embodiment of the present disclosure.
Figure 5B:
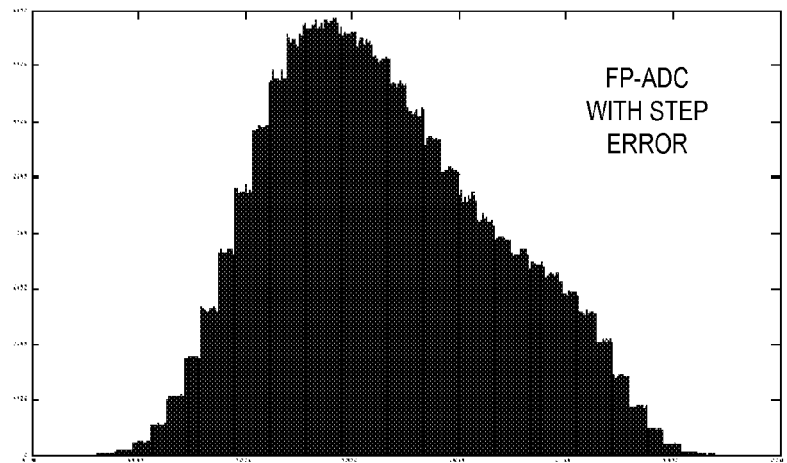
Figure 5C:
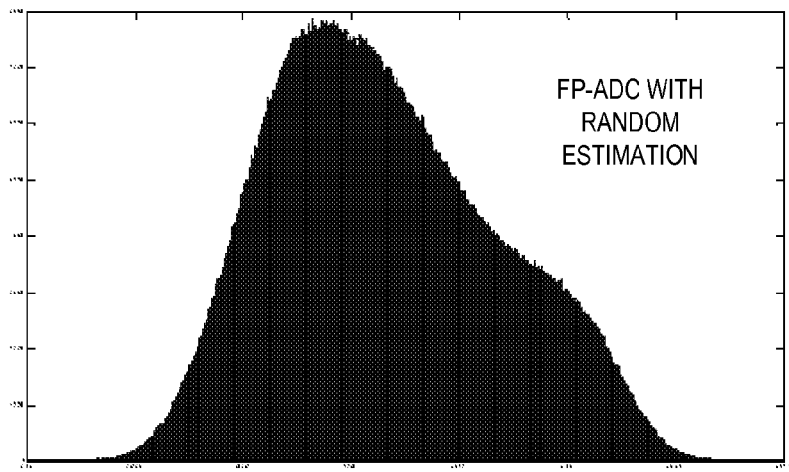

FIGS. 5A-5C are histograms illustrating the difference between an ADC with step error to a random estimation ADC, in accordance with an embodiment of the present disclosure. FIG. 5A is an histogram of an ideal analog to digital conversion of a sample analog input. FIG. 5B illustrates a histogram of a conventional floating-point ADC without random estimation of LSBs. As shown, the floating-point ADC without random estimation of LSBs includes significant step/quantization error which can significantly reduce the quality of the output, such as a digital image. FIG. 5C illustrates a histogram of a random estimation floating-point ADC, such as ADC 200 of FIG. 2. As shown, the histogram of FIG. 5C includes smooth transient details rather than the steps of FIG. 5B.

Accordingly, embodiments of the present disclosure may allow a low-bit count floating point ADC (having random estimation) to produce similar quality results, as if it were a high-bit count fixed linear ADC. As shown by FIG. 5C, methods disclosed herein reduce the step-error and data average shift problems associated with conventional floating point ADCs and may even improve high-bit-count accuracy levels.

The image sensors disclosed herein may be included in a digital still camera, digital video camera, camera phone, picture phone, video phone, camcorder, webcam, camera in a computer system, security camera, medical imaging device, optical mouse, toy, game, scanner, automotive image sensor, or other types of electronic image and/or video acquisition device. Depending on the implementation, the electronic image and/or video acquisition device may also include other components, such as, for example, a light source to emit light, one or more lenses optically coupled to focus light on the array of pixels, a shutter optically coupled to allow light to pass through the one or more lenses, a processor to process image data, and a memory to store image data, to name just a few examples.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other. For example, a calibration circuit may be coupled with a column ADC circuit via an intervening switch.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the configurations, functions, and manner of operation and use, of the components of the embodiments. All equivalent relationships to those illustrated in the drawings and described in the specification are encompassed within embodiments. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

One or more embodiments include an article of manufacture (e.g., a computer program product) that includes a machine-accessible and/or machine-readable medium. The medium may include, a mechanism that provides, for example stores, information in a form that is accessible and/or readable by the machine. The machine-accessible and/or machine-readable medium may provide, or have stored thereon, one or more or a sequence of instructions and/or data structures that if executed by a machine causes or results in the machine performing, and/or causes the machine to perform, one or more or a portion of the operations or methods or the techniques shown in the figures disclosed herein.

In one embodiment, the machine-readable medium may include a tangible non-transitory machine-readable storage media. For example, the tangible non-transitory machine-readable storage media may include a floppy diskette, an optical storage medium, an optical disk, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, or a combinations thereof. The tangible medium may include one or more solid or tangible physical materials, such as, for example, a semiconductor material, a phase change material, a magnetic material, etc.

Examples of suitable machines include, but are not limited to, digital cameras, digital video cameras, cellular telephones, computer systems, other electronic devices having pixel arrays, and other electronic devices capable of capturing images. Such electronic devices typically include one or more processors coupled with one or more other components, such as one or more storage devices (non-transitory machine-readable storage media). Thus, the storage device of a given electronic device may stores code and/or data for execution on the one or more processors of that electronic device. Alternatively, one or more parts of an embodiment may be implemented using different combinations of software, firmware, and/or hardware.

It should also be appreciated that reference throughout this specification to "one embodiment", "an embodiment", or "one or more embodiments", for example, means that a particular feature may be included in the practice of the invention (e.g., in at least one embodiment). Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment.

What is claimed is:

1. A method of converting a first analog signal into a digital signal, the method comprising:
   generating one or more random least significant bits (LSBs) of the digital signal;
   converting the random LSBs into a second analog signal;
   subtracting the second analog signal from the first analog signal to generate a modified first analog signal;
   converting the modified first analog signal into one or more most significant bits (MSBs) of the digital signal with an M-bit analog-to-digital converter; and
   combining the random LSBs with the MSBs to generate the digital signal.

2. The method of claim 1, wherein the one or more MSBs includes M number of bits, and wherein the M-bit analog-to-digital converter has a maximum resolution of M bits.

3. The method of claim 1, wherein generating the one or more random LSBs includes generating a N number of random bits, wherein the number of random bits varies responsive to a magnitude of first analog signal.

4. The method of claim 3, wherein combining the random LSBs with the MSBs includes shifting the MSBs by N number of bits and adding the LSBs to the shifted MSBs.

5. The method of claim 4, wherein combining the random LSBs with the MSBs further includes subtracting $2^{(N-1)}$ from the shifted MSBs.

6. The method of claim 1, wherein the digital signal is a mantissa of a floating point output, the method further comprising determining and generating an exponent of the floating point output.

7. A random estimation analog-to-digital converter for converting a first analog signal into a digital signal, the converter comprising:
   a random bit generator coupled to generate one or more random least significant bits (LSBs) of the digital signal;
   a digital-to-analog converter coupled to the random bit generator to convert the random LSBs into a second analog signal;
   a summer coupled to the random bin generator to subtract the second analog signal from the first analog signal to generate a modified first analog signal;
   an M-bit analog-to-digital converter for converting the modified first analog signal into one or more most significant bits (MSBs) of the digital image signal; and
   a digital combiner coupled to combine the random LSBs with the MSBs to generate the digital signal.

8. The random estimation analog-to-digital converter of claim 7, wherein the one or more MSBs includes M number of bits, and wherein the M-bit analog-to-digital converter has a maximum resolution of M bits.

9. The random estimation analog-to-digital converter of claim 7, wherein the random bit generator generates an N number of random bits, wherein the random bit generator varies the number of random bits responsive to a magnitude of first analog signal.

10. The random estimation analog-to-digital converter of claim 9, wherein the digital combiner is configured to shift the MSBs by N number of bits and then add the LSBs to the shifted MSBs.

11. The random estimation analog-to-digital converter of claim 10, wherein the digital combiner is further configured to subtract $2^{(N-1)}$ from the shifted MSBs.

12. The random estimation analog-to-digital converter of claim 7, wherein the digital signal is a mantissa of a floating point output of the random estimation analog-to-digital converter, the random estimation analog-to-digital converter configured to further determine and generate an exponent of the floating point output.

13. A method of converting an analog image data signal into a digital image data signal, the method comprising:
   acquiring the analog image data signal from a bit line coupled to a pixel cell of an image sensor;
   generating one or more random least significant bits (LSBs) of the digital image signal;
   converting the random LSBs into a second analog signal;
   subtracting the second analog signal from the analog image data signal to generate a modified analog image data signal;
   converting the modified analog image signal into one or more most significant bits (MSBs) of the digital image signal with an M-bit analog-to-digital converter; and
   combining the random LSBs with the MSBs to generate the digital image signal.

14. The method of claim 13, wherein the one or more MSBs includes M number of bits, and wherein the M-bit analog-to-digital converter has a maximum resolution of M bits.

15. The method of claim 13, wherein generating the one or more random LSBs includes generating a N number of random bits, wherein the number of random bits varies responsive to a magnitude of analog image data signal.

16. The method of claim 15, wherein combining the random LSBs with the MSBs includes shifting the MSBs by N number of bits and then adding the LSBs to the shifted MSBs.

17. The method of claim 16, wherein combining the random LSBs with the MSBs further includes subtracting $2^{(N-1)}$ from the shifted MSBs.

18. The method of claim 13, wherein the digital signal is a mantissa of a floating point output, the method further comprising determining and generating an exponent of the floating point output.

19. An image sensor for generating a digital image data signal, the image sensor comprising:
   a pixel array including a plurality of pixel cells arranged into rows and columns for capturing analog image data;
   a bit line coupled to at least one of the pixel cells within a column of the pixel array; and
   readout circuitry coupled to the bit line to readout an analog image data signal representative of the analog image data from the at least one pixel, the readout circuitry including a random estimation analog-to-digital converter (ADC) for converting the analog image data signal into the digital image data signal, the converter comprising:

a random bit generator coupled to generate one or more random least significant bits (LSBs) of the digital image signal;

a digital-to-analog converter coupled to the random bit generator to convert the random LSBs into a second analog signal;

a summer coupled to the random bit generator to subtract the second analog signal from the analog image data signal to generate a modified analog image data signal;

an M-bit analog-to-digital converter for converting the modified analog image data signal into one or more most significant bits (MSBs) of the digital image signal; and a digital combiner coupled to combine the random LSBs with the MSBs to generate the digital image signal.

20. The image sensor of claim 19, wherein the one or more MSBs includes M number of bits, and wherein the M-bit analog-to-digital converter has a maximum resolution of M bits.

21. The image sensor of claim 19, wherein the random bit generator generates an N number of random bits, and wherein the random bit generator varies the number of random bits responsive to a magnitude of analog image data signal.

22. The image sensor of claim 21, wherein the digital combiner is configured to shift the MSBs by N number of bits and then add the LSBs to the shifted MSBs.

23. The image sensor of claim 22, wherein the digital combiner is further configured to subtract $2^{(N-1)}$ from the shifted MSBs.

24. The image sensor of claim 19, wherein the digital image data signal is a mantissa of a floating point output of the random estimation analog-to-digital converter, the random estimation analog-to-digital converter configured to further determine and generate an exponent of the floating point output.

\* \* \* \* \*